United States Patent [19]

Fenk et al.

[11] Patent Number: 5,382,849
[45] Date of Patent: Jan. 17, 1995

[54] CIRCUIT CONFIGURATION FOR SIGNAL LIMITATION AND FIELD INTENSITY DETECTION

[75] Inventors: Josef Fenk, Eching/Ottenburg; Werner Veit, München, both of Germany

[73] Assignee: Siemens Aktiengesellschaft, Munich, Germany

[21] Appl. No.: 872,885

[22] Filed: Apr. 23, 1992

[30] Foreign Application Priority Data

Apr. 24, 1991 [EP] European Pat. Off. ............ 91106616

[51] Int. Cl.[6] ................................................ H03K 5/08
[52] U.S. Cl. ...................................... 327/310; 330/152; 327/50; 327/65; 327/327; 327/309
[58] Field of Search ............... 307/490, 494, 455, 254, 307/355, 542, 543, 555, 556, 557, 567, 350, 540, 558; 328/169, 171, 127; 330/152, 252

[56] References Cited

U.S. PATENT DOCUMENTS

| | | | |
|---|---|---|---|
| 3,413,562 | 11/1968 | Hartin et al. | 307/542 |
| 3,541,459 | 11/1970 | Woodbury | 328/171 |
| 4,065,724 | 12/1977 | Wicklund, Jr. | 330/252 |
| 4,166,924 | 9/1979 | Berkley et al. | 307/540 |
| 4,454,435 | 6/1984 | Burns | 307/542 |
| 4,659,995 | 4/1987 | Feistel | 328/167 |
| 4,723,082 | 2/1988 | Asano et al. | 307/475 |
| 4,736,124 | 4/1988 | McFarland, Jr. | 307/471 |
| 4,737,664 | 4/1988 | Wilhelm et al. | 307/455 |
| 4,972,512 | 11/1990 | Garskamp | 307/490 |
| 4,985,643 | 1/1991 | Proebsting | 307/443 |
| 4,990,803 | 2/1991 | Gilbert | 307/492 |
| 5,281,860 | 1/1994 | Krenik et al. | 307/243 |

Primary Examiner—Timothy P. Callahan
Assistant Examiner—Terry D. Cunningham
Attorney, Agent, or Firm—Herbert L. Lerner; Laurence A. Greenberg

[57] ABSTRACT

A circuit configuration includes a limiter amplifier having n series-connected limiter stages. The limiter stages are alternatingly direct-current coupled and alternating-current coupled. A detector circuit is connected to the limiter amplifier.

8 Claims, 5 Drawing Sheets

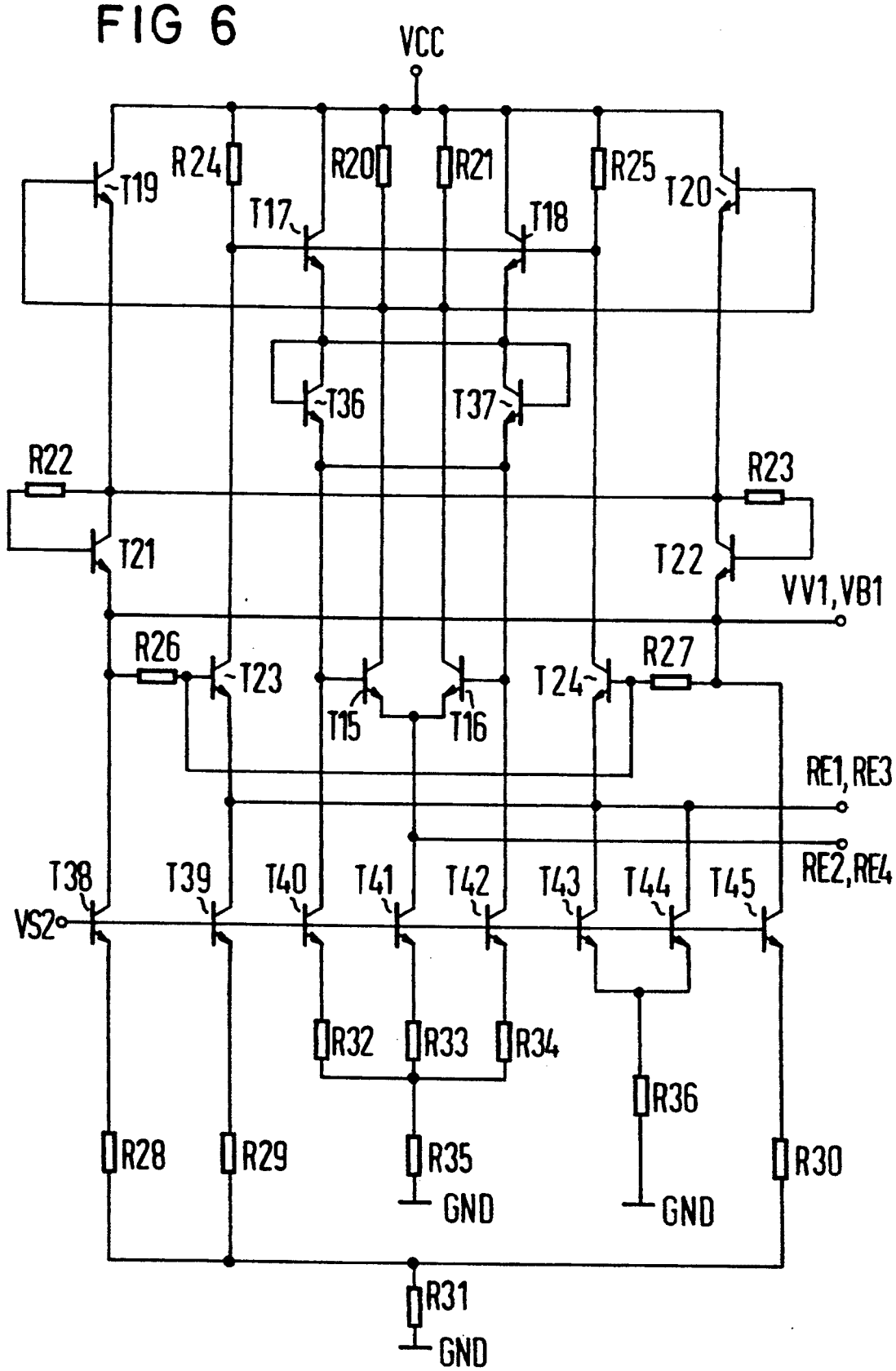

CIRCUIT CONFIGURATION FOR SIGNAL LIMITATION AND FIELD INTENSITY DETECTION

BACKGROUND OF THE INVENTION

1. Field of the Invention

The invention relates to a circuit configuration for signal limitation and field intensity detection, having a limiter amplifier including n series-connected limiter stages and a detector circuit connected to the limiting amplifier.

2. Description of the Related Arts

In reception circuits in radio and television technology as well as mobile radio technology, so-called field intensity monitors are often needed. As is described in a paper by J. Fenk, W. Birth, R. G. Irvine, P. Sehrig and K. R. Schön, entitled "An RF Front-End for Digital Mobile Radio" in IEEE 1990 Bipolar Circuits and Technology Meeting 11.2, such a field intensity monitor includes, for instance, a multi-stage, in that case a seven-stage, limiter amplifier, to which a seven-stage field intensity detector circuit is connected. In order to avoid interference from incident offset voltages when the various limiter stages are coupled, all of the limiter stages are coupled to one another with alternating current. However, in operation with a typical intermediate frequency of approximately 450 kHz, relatively high capacities are needed. With an integrated circuit construction, they require a relatively large surface area, which in turn means that the entire integrated circuit occupies a great amount of surface area.

SUMMARY OF THE INVENTIONS

It is accordingly an object of the invention to provide a circuit configuration for signal limitation and field intensity detection, which overcomes the hereinaforementioned disadvantages of the heretofore-known devices of this general type and which requires less surface area when made with integrated circuitry.

With the foregoing and other objects in view there is provided, in accordance with the invention, a circuit configuration, comprising a limiter amplifier including n series-connected limiter stages, said limiter stages being alternatingly direct-current coupled and alternating-current coupled, and a detector circuit connected to said limiter amplifier.

In accordance with another feature of the invention, each of said limiter stages includes a first and a second transistor of one conduction type having bases, having collectors and having coupled emitters, a Current source connected between the coupled emitters of said transistors and a first supply potential, and resistors each being connected between the collector of a respective one of said transistors and a second supply potential.

In accordance with a further feature of the invention, the limiter stages include a third and a fourth transistor of the one conduction type having collectors connected to the second supply potential and bases forming signal inputs of said limiter stages; a fifth and a sixth transistor of the one conduction type having collectors each being connected to the emitter of a respective one of said third and fourth transistors, having emitters each being connected to the base of a respective one of said first and second transistors, and having bases; and current sources each being connected between the emitter of a respective one of said fifth and sixth transistors and the first supply potential.

In accordance with an added feature of the invention, the collector and the base of said fifth transistor are connected to one another and the collector and the base of said sixth transistor are connected to one another, in said limiter stages for direct-current coupling to a preceding limiter stage.

In accordance with an additional feature of the invention, the limiter stages for alternating-current coupling to a preceding limiter stage include capacitors each being connected between the collector and the base of a respective one of said fifth and sixth transistors.

In accordance with yet another feature of the invention, each of said capacitors includes two transistors of the same conduction type, and each of said transistors has a collector and an emitter being connected to the base of the other of said transistors.

In accordance with yet a further feature of the invention, the detector circuit includes n detector stages each being assigned and connected to a respective one of said limiter stages, said detector stages having outputs being coupled to one another.

In accordance with yet an added feature of the invention, the detector stages each include a pair of seventh and eighth transistors of the other conduction type having bases connected to one another and emitters connected to the second supply potential; a pair of ninth and tenth transistors of the other conduction type having bases connected to one another and emitters connected to the second supply potential; eleventh and twelfth transistors of the other conduction type each having an emitter connected to the coupled bases of a respective one of said pairs of transistor and a collector connected to the first supply potential; a thirteenth transistor of the one conduction type having a collector connected to the base of said eleventh transistor and to the collector of said seventh transistor and having a base connected to at least a reference voltage source; a fourteenth transistor of the one conduction type having a collector connected to the base of said twelfth transistor and to the collectors of said eighth and ninth transistors and having a base forming an input of said detector stage; said thirteenth and fourteenth transistors having emitters being coupled together; a current source connected between the coupled-together emitters of said thirteenth and fourteenth transistors and the first supply potential; and three resistors connected in a Y-circuit between the second supply potential, the coupled bases of said seventh and eighth transistors and the coupled of said ninth and tenth transistors.

In accordance with yet an additional feature of the invention, there is provided a reference voltage source having fifteenth and sixteenth transistors of the one conduction type having collectors, having bases, and having coupled emitters forming outputs of said reference voltage source; a current source connected between the coupled emitters of said fifteenth and sixteenth transistors and the first supply potential; resistors each being connected between the collector of a respective one of said fifteenth and sixteenth transistors and the second supply potential; current sources each being connected between the base of a respective one of said fifteenth and sixteenth transistors and the first supply potential; seventeenth and eighteenth transistors of the one conduction type having collectors connected to the second supply potential and having emitters, diodes each being wired in the conducting direction between the emitter of a respective one of said seventeenth and eighteenth transistors and the base of a respective one of said fifteenth and sixteenth transistors; nineteenth and twentieth transistors of the one conduction type having collectors connected to the second supply potential and having emitters; twenty-first and twenty-second transistors of the one conduction type having bases and having collectors and emitters defining collector-to-emitter paths each being connected to the emitter of a respective one of said nineteenth and twentieth transistors; resistors each being connected between the base and the collector of a respective one of said twenty-first and twenty-second transistors; current sources each being connected between the collector-to-emitter path of a respective one of said twenty-first and twenty-second transistors and the first supply potential; twenty-third and twenty-fourth transistors having collectors each being connected to the base of a respective one of said seventeenth and eighteenth transistors and having emitters and bases; resistors each being connected between the collector of a respective one of said twenty-third and twenty-fourth transistors and the second supply potential; resistors each being connected between the base of a respective one of said twenty-third and twenty-fourth transistors and the emitter of a respective one of said twenty-first and twenty-second transistors; current sources each being connected between the emitter of a respective one of said twenty-third and twenty-fourth transistors and the first supply potential; the bases of said nineteenth and twentieth transistors and the collectors of said fifteenth and sixteenth transistors being connected to one another; the bases of said seventeenth and eighteenth transistors being connected to one another, and the emitters of said seventeenth and eighteenth transistors being connected to one another; the bases of said fifteenth and sixteenth transistors being connected to one another; the emitters of said twenty-first and twenty-second transistors being connected to one another, and the collectors of said twenty-first and twenty-second transistors being connected to one another; and the bases of said twenty-third and twenty-fourth transistors being connected to one another, and the emitters of said twenty-third and twenty-fourth transistors being connected to one another to form outputs of said reference voltage source.

In accordance with a concomitant feature of the invention, the emitters of said twenty-first and twenty-second transistors form further outputs.

Other features which are considered as characteristic for the invention are set forth in the appended claims.

Although the invention is illustrated and described herein as embodied in a circuit configuration for signal limitation and field intensity detection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a schematic circuit diagram of an embodiment of a reference voltage source in a circuit configuration according to the invention.

DESCRIPTION OF THE REFERRED EMBODIMENT

Figure 1:
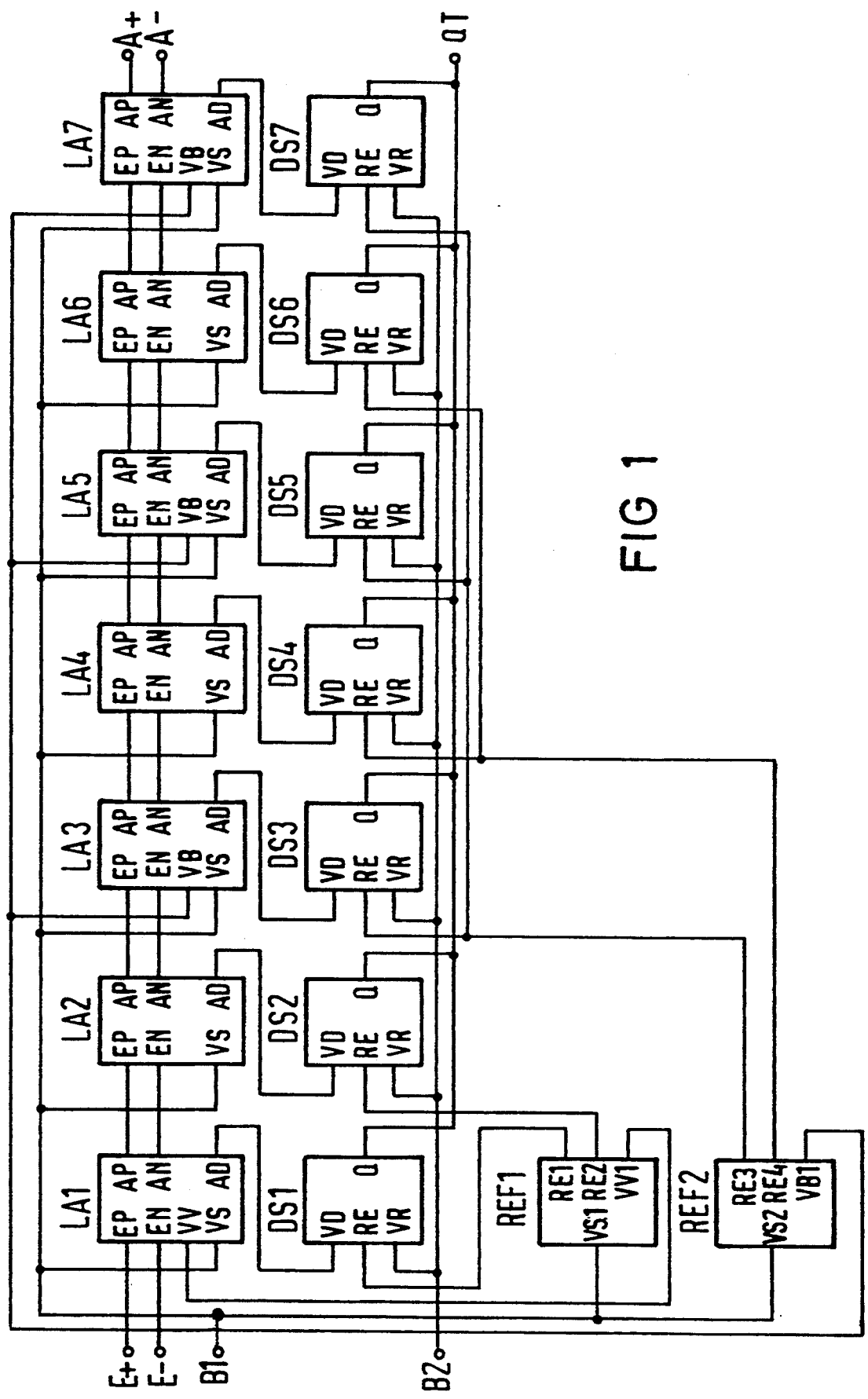
FIG. 1 is a basic block circuit diagram of an embodiment of a circuit configuration according to the invention.
Figure 2:
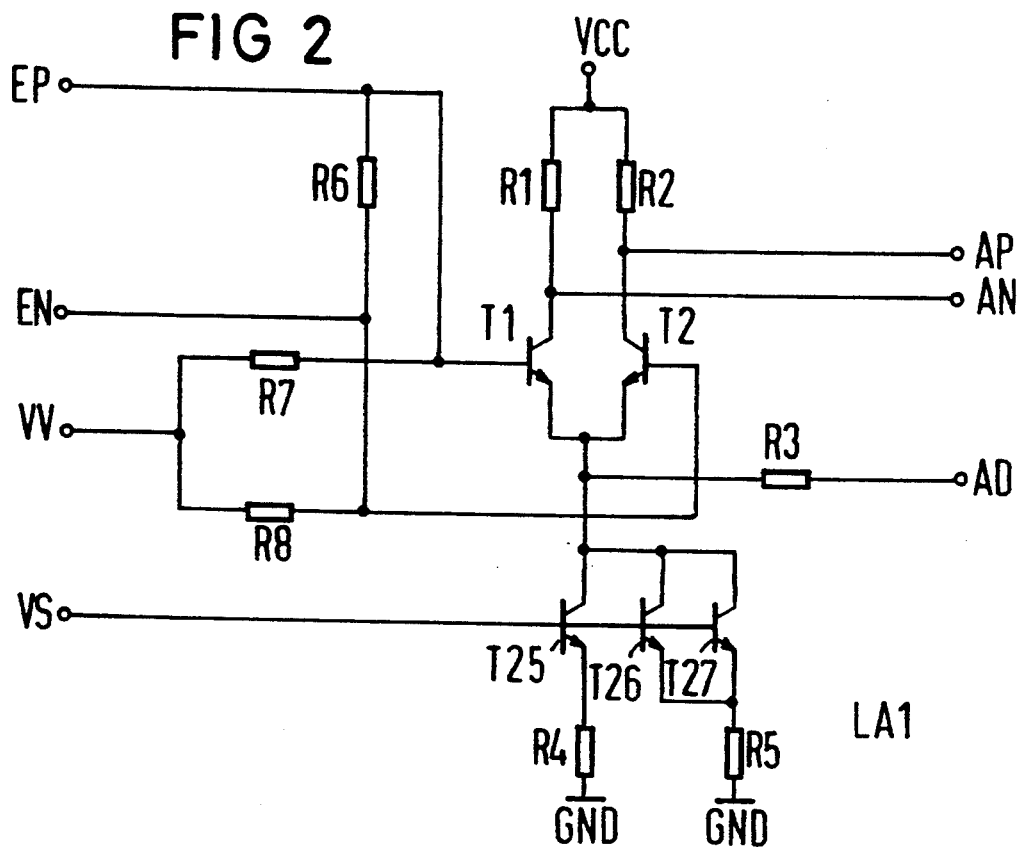
FIG. 2 is a schematic circuit diagram of a first embodiment of a limiter stage in a circuit configuration according to the invention.
Figure 3:
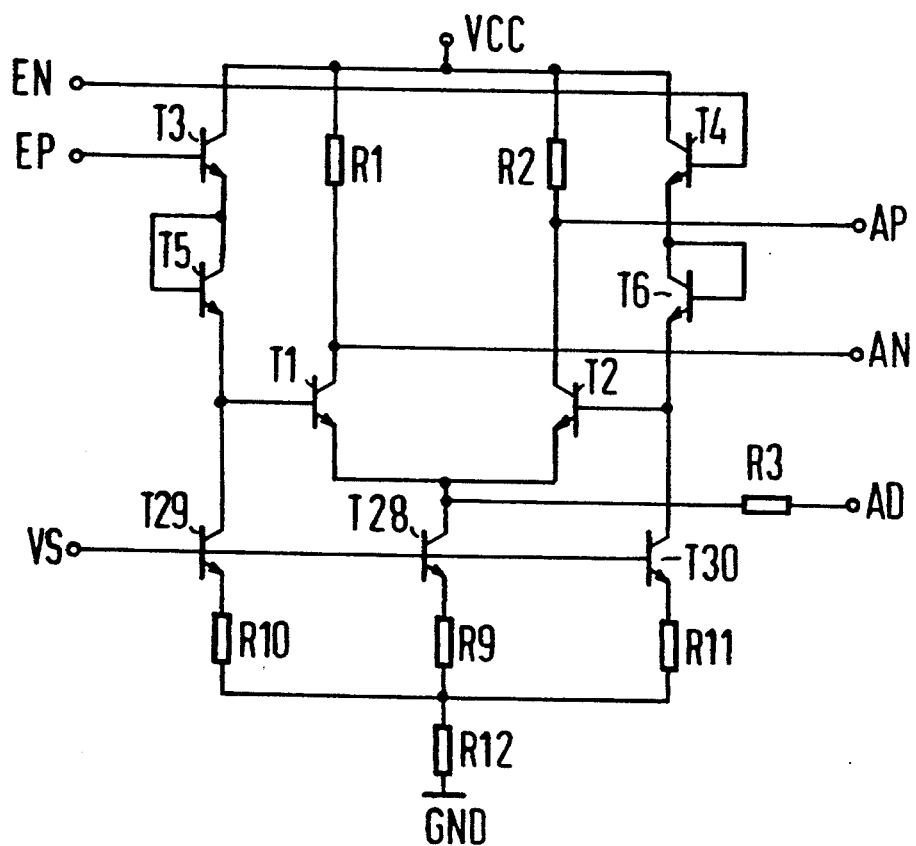
FIG. 3 is a schematic circuit diagram of a second embodiment of a limiter stage in a circuit configuration according to the invention.
Figure 4:
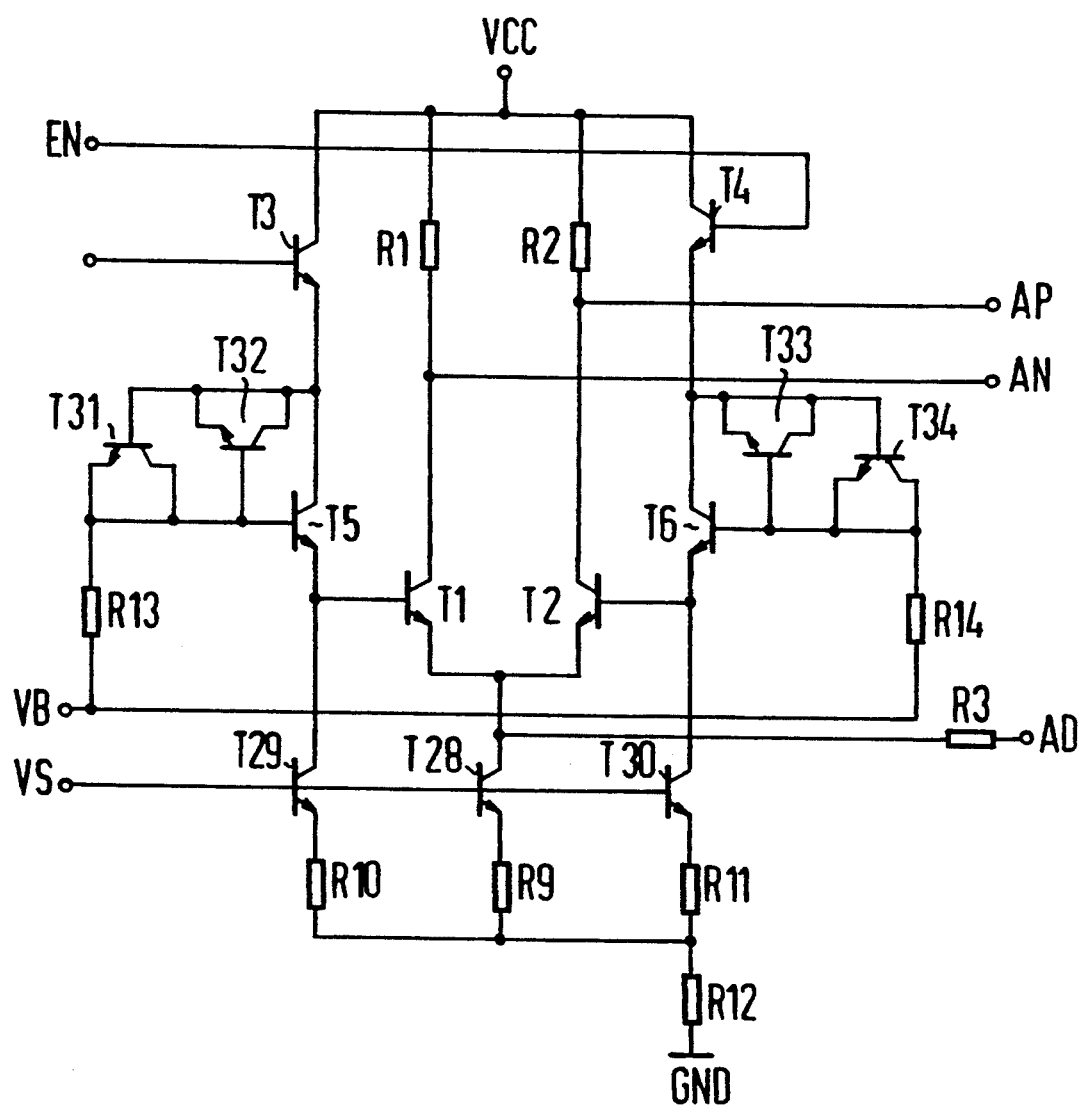
FIG. 4 is a a schematic circuit diagram of third embodiment of a limiter stage in a circuit configuration according to the invention.

Referring now to the figures of the drawing in detail and first, particularly, to FIG. 1 thereof, there is seen an exemplary embodiment which has n=7 series-connected limiter stages LA1 to LA7 of a limiter amplifier. As is shown in FIGS. 2, 3 and 4, all of the limiter stages LA1 to LA7 each include two npn transistors T1 and T2, each one having a coupled emitter connected to a negative or first supply potential GND with the interposition of a current source, and a collector connected to a positive or second supply potential VCC with the interposition of a respective resistor R1 and R2. The collectors of the two transistors T1 and T2 (of one conduction type npn) moreover form signal outputs AP and AN of the applicable limiter stage. One signal output Dode AD is connected to the coupled emitters of the transistors T1 and T2 through a resistor R3. As compared with the remaining limiter stages LA2 to LA7, the limiter stage LA1 shown in FIG. 2 differs firstly in the structure of the current source which differs from the other limiter stages LA2 to LA7, and secondly in a differing wiring of the input circuit. In this case, the current source includes three transistors T25, T26, T27, having collectors which are connected to one another and to the coupled emitters of the transistors T1 and T2. The bases of the three transistors T25, T26, T27 are coupled to one another and to a reference potential input VS. The emitter of the transistor T25 is connected to the negative supply potential GND through a resistor R4, and the coupled emitters of the transistors T26 and T27 are connected to the negative supply potential GND through a resistor R5. In this case, the current furnished by this current source is higher than the current of the corresponding current sources of the remaining limiter stages LA2 to LA7. Furthermore, in the limiter stage LA1, one resistor R6 is connected between the bases of the two transistors T1 and T2, which are intended as signal inputs EP and EN. In addition, the bases of these two transistors T1 and T2 are each connected to a reference potential input VV through a respective resistor R7 and R8.

In the other limiter stages LA2 to LA7, each one of two npn transistor T3 and T4 has a collector connected to the positive supply potential VCC and a base which forms a signal input EP and EN of these limiter stages LA2 to LA7. The limiter stages LA2 to LA7 also include npn transistors T5 and T6 having collectors which are each connected to the emitters of the transistors T3 and T4. The emitters of the npn transistors T5 and T6 are each connected directly to the bases of the transistors T1 and T2 and are each connected through a respective current source with transistors T29 and T30 to the negative supply potential GND. Another current source includes a transistor T28. The collector of the transistor T28 is connected to the coupled emitters of the transistors T1 and T2. The collectors of the transistors T29 and T30 are respectively connected to the emitters of the transistor T5 and T6. The bases of the transistors T28, T29, T30 are coupled both to one another and to the reference potential input VS of the limiter stages LA2 to LA7. The emitters of the transistors T28, T29, T30 are each carried through a respective resistor R9, R10, R11 to a common node point, which in turn is connected to the negative supply potential GND through a resistor R12.

The limiter stages LA2, LA4, LA6 shown in FIG. 3 differ from the limiter stages LA3, LA5, LA7 shown in FIG. 4. In the case of the transistors T5 and T6, the base and collector of each are connected to one another in the limiter stages LA2, LA4, LA6. In contrast, in the limiter stages LA3, LA5, LA7, on one hand, a capacitor is connected between the collectors and the bases of each of the transistors T5 and T6, and on the other hand, the bases of the transistors T5 and T6 are each coupled through a respective resistor R13 and R14 to a reference potential input VB. The capacitors are each formed by two respective npn transistors T31 and T32 or T33 and T34. The collector and emitter of each of the transistors T31 and T33 are connected to the base of a respective one of the transistors T32 and T34, and vice versa. As a result of the different structures Of the limiter stages LA2, LA4, LA6 as compared to the limiter stages LA3, LA5, LA7, either a direct current coupling or an alternating current coupling with the preceding limiter stage takes place. This means that the limiter stages LA1 and LA2, LA3 and LA4, and LA5 and LA6 are direct-current-coupled, whereas the limiter stages LA2 and LA3, LA4 and LA5, and LA6 and LA7 are alternating-current-coupled. The differing structure of the limiter stage LA1 serves the purpose of providing a greater absence of noise for this limiter stage LA1, which is connected to inputs E+, E−. The series connection of the various stages is effected in each case by connecting the signal outputs AP, AN to the signal inputs EP, EN of the subsequent stage. As is shown in FIG. 1, the reference potential inputs VS of all of the limiter stages LA1 to LA7 are connected to one another and to a reference potential input B1. The signal outputs AP, AN of the limiter stage LA7 are coupled to signal outputs A+, A−.

Figure 5:
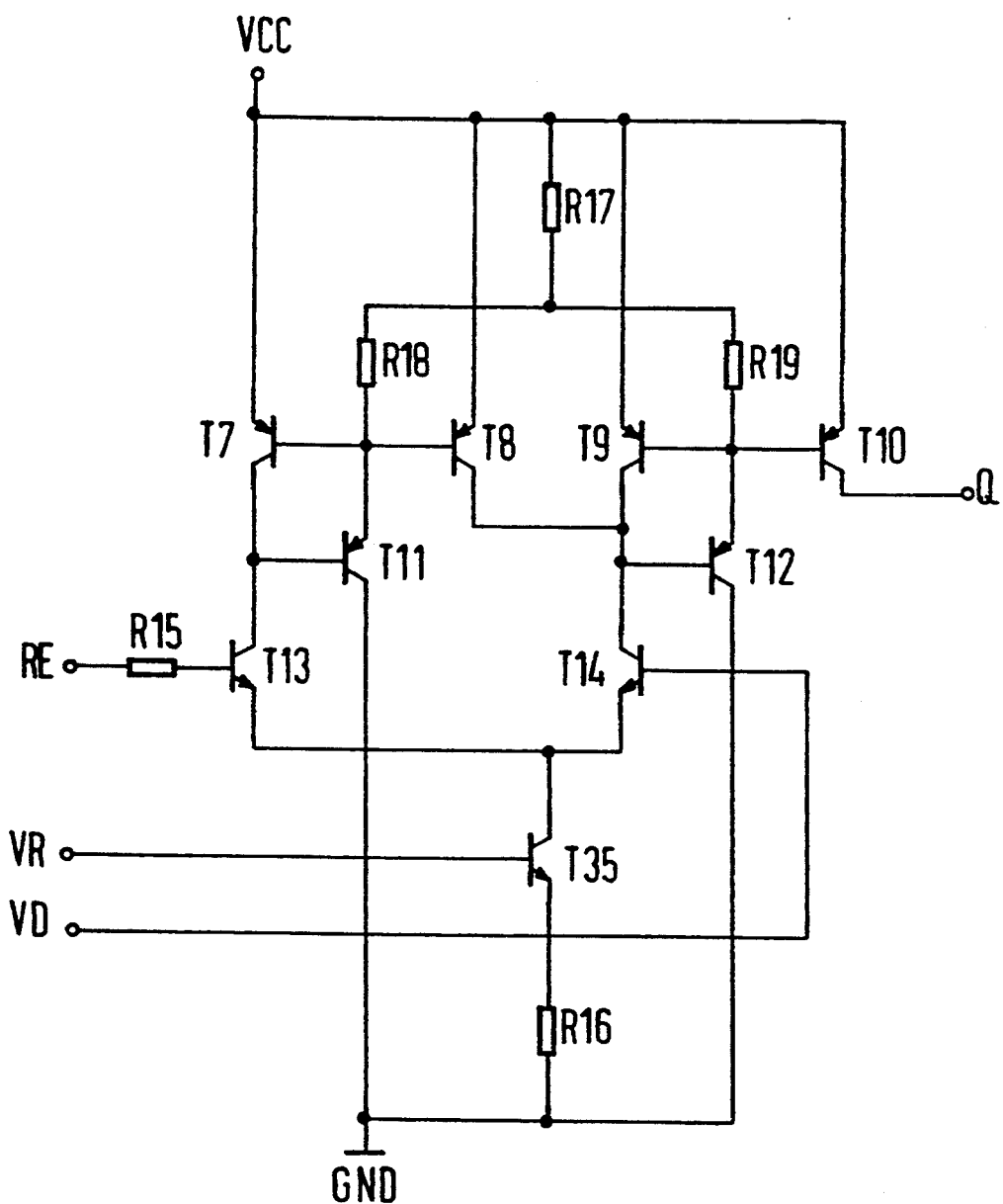
FIG. 5 is a schematic circuit diagram of an embodiment of a detector stage of a circuit configuration according to the invention.

FIG. 5 of the drawing shows the layout of a detector stage. For example, the circuit shown in FIG. 1 may include seven such identically laid out detector stages DS1 to DS7 of a detector circuit. Each detector stage DS1 to DS7 has four pnp transistors T7, T8, T9, T10, having bases which are coupled to one another in pairs and having emitters which are connected to the positive supply potential VCC. Two pnp transistors T11 and T12 have emitters which are respectively connected to the coupled bases of the transistors T7 and T8 or T9 and T10 (of the other conduction type pnp), and have collectors which are connected to the negative supply potential GND. An npn transistor T13 has a collector which is connected to the collector of the transistor T7, and an npn transistor T14 has a collector which is connected to the collector of the transistor T9. The transistors T13 and T14 are coupled to one another on the emitter side and are connected to the negative supply potential GND through a current source. The base of the transistor T13 is connected to a reference potential input RE through a resistor R15, and the base of the transistor T14 is coupled to a signal input VD. The current source includes an npn transistor T35, having a collector which is connected to the coupled emitters of the transistors T13 and T14 and a resistor R16 which is connected between the emitter of the transistor T35 and the negative supply potential GND. A reference potential input VR is connected to the base of the transistor T35. Finally, three resistors R17, R18, R19 are connected in a Y-circuit between the positive supply potential VCC, the coupled bases of the transistors T7 and T8, and the coupled bases of the transistors T9 and T10. In FIG. 1, the signal inputs VD of the detector stages DS1 to DS7 are connected to the signal outputs AD of the corresponding limiter stages LA1 to LA7. All of the reference potential inputs VR are joined together and connected to a reference potential input B2. Likewise, signal outputs Q of all of the limiter stages are joined together and connected to a detector output QT.

As is shown in FIG. 1, the reference potential input VV of the limiter stage LA1 is connected to a reference potential output VV1 of a reference voltage source REF1. The reference voltage source REF1 furthermore has a reference potential output RE1 which is connected to the reference potential input RE of the first detector stage DS1, and a reference potential output RE2, which is connected to the reference potential input RE of the detector stage DS2. A reference potential input VS1 is connected to the reference potential input B1. In addition, a further reference voltage source REF2 is provided with a reference potential input VS2 which is likewise connected to the reference potential input B1, and three reference potential outputs RE3, RE4 and VB1. The reference potential output VB1 is connected to the reference potential inputs VB of the limiter stages LA3, LA5 and LA7. The reference potential output RE3 is connected to the reference potential inputs RE of the detector stages DS3, DS5 and DS7, and the reference potential output RE4 is connected to the reference potential inputs RE of the detector stages DS4 and DS6.

The layout of the two reference voltage sources REF1 and REF2 is shown fundamentally in FIG. 6. The coupled emitters of two npn transistors T15 and T16 are connected to the negative supply potential GND, with the interposition of a current source. The bases of the transistors T15 and T16 are directly connected to one another. The collectors of the two npn transistors T15 and T16 are in turn connected to the positive supply potential VCC, with the interposition of one resistor R20 and R21 each, while the bases thereof are each connected to the negative supply potential GND through a respective current source. Two npn transistors T17 and T18 are coupled on the collector side to the positive supply potential VCC and they are each coupled on the emitter side through a diode wired in the conducting direction, to the bases of the transistors T15 and T16. The two diodes are formed by two npn transistors T36 and T37, in which the base and collector of each are all connected in common. Two npn transistors T19 and T20 have collectors which are connected to the positive supply potential VCC. The emitters of the npn transistors T19 and T20 are connected to the negative supply potential GND with the interposition of the collector-to-emitter paths of respective npn transistors T21 and T22, in which the base and collector are connected to one another through a respective resistor R22 and R23. The collectors of two npn transistors T23 and T24 are each coupled directly to the bases of a respective one of the transistors T17 and T18, and are coupled to the positive supply potential VCC through a respective resistor R24 and R25. The bases of the two npn transistors T23 and T24 are each connected to the emitters of the transistors T21 and T22 through a respective resistor R26 and R27. The emitters of each of the transistors T21 and T22 are also connected to the negative supply potential GND through a respective current source. The various current sources are formed by npn transistors T38 to T45, having collectors which are each connected to the emitters of the respective transistors T21, T23, T36, T15 and T16, T37, T24 and T22. The emitters of the transistors T38, T39 and T45 are each carried through resistors R28, R29 and R30 to a common node point, which is connected to the negative supply potential GND through a resistor R31. The emitters of the transistors T40, T41 and T42 are carried through resistors R32, R33 and R34 to a further node point, which is connected through a resistor R35 to the negative supply potential GND. Finally, the emitters of the transistors T43 and T44 are coupled to one another and are connected through a resistor R36 to the negative supply potential GND. The bases of the transistors T38 to T45 are coupled to one another and to the reference potential input VS2.

To this extent, the reference voltage sources REF1 and REF2 are constructed substantially identically to the corresponding limiter stages and detector stages. They differ from them in that the bases of the transistors T19 and T20 and the collectors of the transistors T15 and T16 are connected to one another, the bases and emitters of the transistors T17 and T18 are each connected to one another, the emitters and collectors of the transistors T21 and T22 are connected to one another, and the bases and emitters of the transistors T23 and T24 are coupled to one another. The coupled emitters of the transistors T21 and T22 are respectively connected to the reference potential output VV1 and the reference potential output VB1. The reference potential outputs RE1 and RE3 are respectively connected to the coupled emitters of the transistors T23 and T24 and the reference potential outputs RE2 and RE4 are connected to the coupled emitters of the transistors T15 and T16. The reference voltage sources REF1 and REF2 differ from one another in that in the case of the reference voltage source REF1, the resistors R22 and R23, and in the case of the reference voltage source REF2 the resistors R26 and R27, assume the lowest possible values or are replaced by a short circuit.

We claim:

1. A circuit configuration, comprising a limiter amplifier including n series-connected limiter stages, where n is an integer, said limiter stages being alternatingly direct-current coupled and alternating-current coupled to one another in said series, and a detector circuit connected to said limiter amplifier for sensing a field strength in said limiter stages, each of the alternating-current coupled stages of said limiter stages including capacitor means for alternating-current coupling; each of said limiter stages including a first and a second transistor of one conduction type having bases, having collectors and having coupled emitters, a current source connected between the coupled emitters of said transistors and a first supply potential, and resistors each being connected between the collector of a respective one of said transistors and a second supply potential; said limiter stages including a third and a fourth transistor of the one conduction type having collectors connected to the second supply potential and bases forming signal inputs of said limiter stages; a fifth and a sixth transistor of the one conduction type having collectors each being connected to the emitter of a respective one of said third and fourth transistors, having emitters each being connected to the base of a respective one of said first and second transistors, and having bases; and current sources each being connected between the emitter of a respective one of said fifth and sixth transistors and the first supply potential.

2. The circuit configuration according to claim 1, wherein the collector and the base of said fifth transistor are connected to one another and the collector and the base of said sixth transistor of the direct-current coupled stages of said limiter stages are connected to one another.

3. The circuit configuration according to claim 1, wherein said capacitor means of said limiter stages for alternating-current coupling to a preceding limiter stage are each connected between the collector and the base of a respective one of said fifth and sixth transistors.

4. The circuit configuration according to claim 3, wherein each of said capacitor means includes two transistors of the same conduction type, and each of said transistors has a collector and an emitter being connected to the base of the other of said transistors.

5. The circuit configuration according to claim 1, wherein said detector circuit includes n detector stages each being assigned and connected to a respective one of said limiter stages, said detector stages having outputs being coupled to one another.

6. The circuit configuration according to claim 1, wherein said detector circuit includes n detector stages each being assigned and connected to a respective one of said limiter stages, said detector stages each including:
   outputs being coupled to one another;
   a pair of seventh and eighth transistors of the other conduction type having bases connected to one another and emitters connected to the second supply potential;
   a pair of ninth and tenth transistors of the other conduction type having bases connected to one another and emitters connected to the second supply potential;
   eleventh and twelfth transistors of the other conduction type each having an emitter connected to the coupled bases of a respective one of said pairs of transistor and a collector connected to the first supply potential;
   a thirteenth transistor of the one conduction type having a collector connected to the base of said eleventh transistor and to the collector of said seventh transistor and having a base;
   a fourteenth transistor of the one conduction type having a collector connected to the base of said twelfth transistor and to the collectors of said eighth and ninth transistors and having a base forming an input of said detector stage;
   said thirteenth and fourteenth transistors having emitters being coupled together;
   a current source connected between the coupled-together emitters of said thirteenth and fourteenth transistors and the first supply potential; and three resistors connected in a Y-circuit between the second supply potential, the coupled bases of said seventh and eighth transistors and the coupled bases of said ninth and tenth transistors.

7. The circuit configuration according to claim 6, including a reference voltage source having:
   fifteenth and sixteenth transistors of the one conduction type having collectors, having bases, and having coupled emitters forming an output of said reference voltage source;
   a current source connected between the coupled emitters of said fifteenth and sixteenth transistors and the first supply potential;
   resistors each being connected between the collector of a respective one of said fifteenth and sixteenth transistors and the second supply potential;
   current sources each being connected between the base of a respective one of said fifteenth and sixteenth transistors and the first supply potential;
   seventeenth and eighteenth transistors of the one conduction type having collectors connected to the second supply potential and having emitters, diodes each being wired in the conducting direction between the emitter of a respective one of said seventeenth and eighteenth transistors and the base of a respective one of said fifteenth and sixteenth transistors;
   nineteenth and twentieth transistors of the one conduction type having collectors connected to the second supply potential and having emitters;
   twenty-first and twenty-second transistors of the one conduction type having bases and having collectors and emitters defining collector-to-emitter paths each being connected to the emitter of a respective one of said nineteenth and twentieth transistors;
   resistors each being connected between the base and the collector of a respective one of said twenty-first and twenty-second transistors;
   current sources each being connected between the collector-to-emitter path of a respective one of said twenty-first and twenty-second transistors and the first supply potential;
   twenty-third and twenty-fourth transistors having collectors each being connected to the base of a respective one of said seventeenth and eighteenth transistors and having emitters and bases;
   resistors each being connected between the collector of a respective one of said twenty-third and twenty-fourth transistors and the second supply potential;
   resistors each being connected between the base of a respective one of said twenty-third and twenty-fourth transistors and the emitter of a respective one of said twenty-first and twenty-second transistors;
   current sources each being connected between the emitter of a respective one of said twenty-third and twenty-fourth transistors and the first supply potential;
   the bases of said nineteenth and twentieth transistors and the collectors of said fifteenth and sixteenth transistors being connected to one another;
   the bases of said seventeenth and eighteenth transistors being connected to one another, and the emitters of said seventeenth and eighteenth transistors being connected to one another;
   the bases of said fifteenth and sixteenth transistors being connected to one another;
   the emitters of said twenty-first and twenty-second transistors being connected to one another, and the collectors of said twenty-first and twenty-second transistors being connected to one another; and
   the bases of said twenty-third and twenty-fourth transistors being connected to one another, and the emitters of said twenty-third and twenty-fourth transistors being connected to one another to form outputs of said reference voltage source.

8. The circuit configuration according to claim 7, wherein the emitters of said twenty-first and twenty-second transistors form a further output.

* * * * *